United States Patent
Chen et al.

(10) Patent No.: US 11,761,751 B2
(45) Date of Patent: *Sep. 19, 2023

(54) THIN FILM METROLOGY

(71) Applicant: Taiwan Semiconductor Manufacturing Co., Ltd., Hsinchu (TW)

(72) Inventors: Chih Hung Chen, Hsinchu (TW); Kei-Wei Chen, Hsinchu (TW); Te-Ming Kung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,910

(22) Filed: Jun. 22, 2022

(65) Prior Publication Data

US 2022/0316861 A1    Oct. 6, 2022

Related U.S. Application Data

(63) Continuation of application No. 17/194,934, filed on Mar. 8, 2021, now Pat. No. 11,397,078.

(60) Provisional application No. 63/027,066, filed on May 19, 2020.

(51) Int. Cl.
*G01B 11/06* (2006.01)
*G01Q 60/24* (2010.01)

(52) U.S. Cl.
CPC ........ *G01B 11/0616* (2013.01); *G01Q 60/24* (2013.01)

(58) Field of Classification Search
CPC .......................... G01B 11/0616; G01Q 60/24
USPC ................ 850/21, 22, 24, 30, 33, 37, 38, 39
See application file for complete search history.

(56) References Cited

U.S. PATENT DOCUMENTS

| | | | |
|---|---|---|---|
| 11,397,078 B2 * | 7/2022 | Chen | G01Q 60/34 |
| 2007/0287076 A1 | 12/2007 | Masaki et al. | |
| 2019/0011358 A1 | 1/2019 | Kjoller et al. | |

OTHER PUBLICATIONS

Nowak et al., "Nanoscale chemical imaging by photoinduced force microscopy," Sci Adv 2(3):Mar. 25, 2016. (9 pages).

* cited by examiner

*Primary Examiner* — Nicole M Ippolito
(74) *Attorney, Agent, or Firm* — Seed IP Law Group LLP

(57) ABSTRACT

A method of evaluating a thickness of a film on a substrate includes detecting atomic force responses of the film to exposure of electromagnetic radiation in the infrared portion of the electromagnetic spectrum. The use of atomic force microscopy to evaluate thicknesses of thin films avoids underlayer noise commonly encountered when optical metrology techniques are utilized to evaluate film thicknesses. Such underlayer noise adversely impacts the accuracy of the thickness evaluation.

20 Claims, 8 Drawing Sheets

| Material 1 | Force Response | Measured Thickness |
|---|---|---|
| | A | 1 |
| | B | 2 |
| | C | 3 |
| | D | 4 |
| | E | 5 |
| | F | 6 |
| | G | 7 |
| | H | 8 |
| | I | 9 |
| | ... | ... |
| | ... | ... |
| | ... | ... |

FIG. 5

| Material 1 in layer 1 and Material 2 in layer 2 | Force Response at First Wavelength | Force Response at Second Wavelength | Measured Thickness |
|---|---|---|---|
| | A | A1 | 1 |
| | B | B2 | 2 |
| | C | C3 | 3 |
| | D | D4 | 4 |
| | ... | ... | ... |
| | ... | ... | ... |

FIG. 6

THIN FILM METROLOGY

PRIORITY CLAIM AND CROSS-REFERENCE

The present application claims priority to U.S. application Ser. No. 17/194,934, filed on Mar. 8, 2021, which claims the benefit from U.S. Provisional Patent Application No. 63/027,066, filed on May 19, 2020, titled THIN FILM THICKNESS METROLOGY. The applications are incorporated herein by reference in its entirety.

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate. The number of transistors that can be included for a given area of semiconductor substrate can be increased by reducing the size of the transistors. Reducing the size of the transistors may involve altering the thicknesses of layers of material as well the geometry of features created on the semiconductor substrate. In the design process of reducing the size of transistors, it is important to evaluate the thickness of the layers of material used to form the transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is an example of a lookup table of force responses generated by infrared atomic force microscopy correlated with measured film thicknesses in accordance with an embodiment of the present disclosure.

FIG. 6 is an example of a lookup table of force responses at two different wavelengths generated by infrared atomic force microscopy correlated with measured film thicknesses in accordance with an embodiment of the present disclosure.

DETAILED DESCRIPTION

Figure 1:
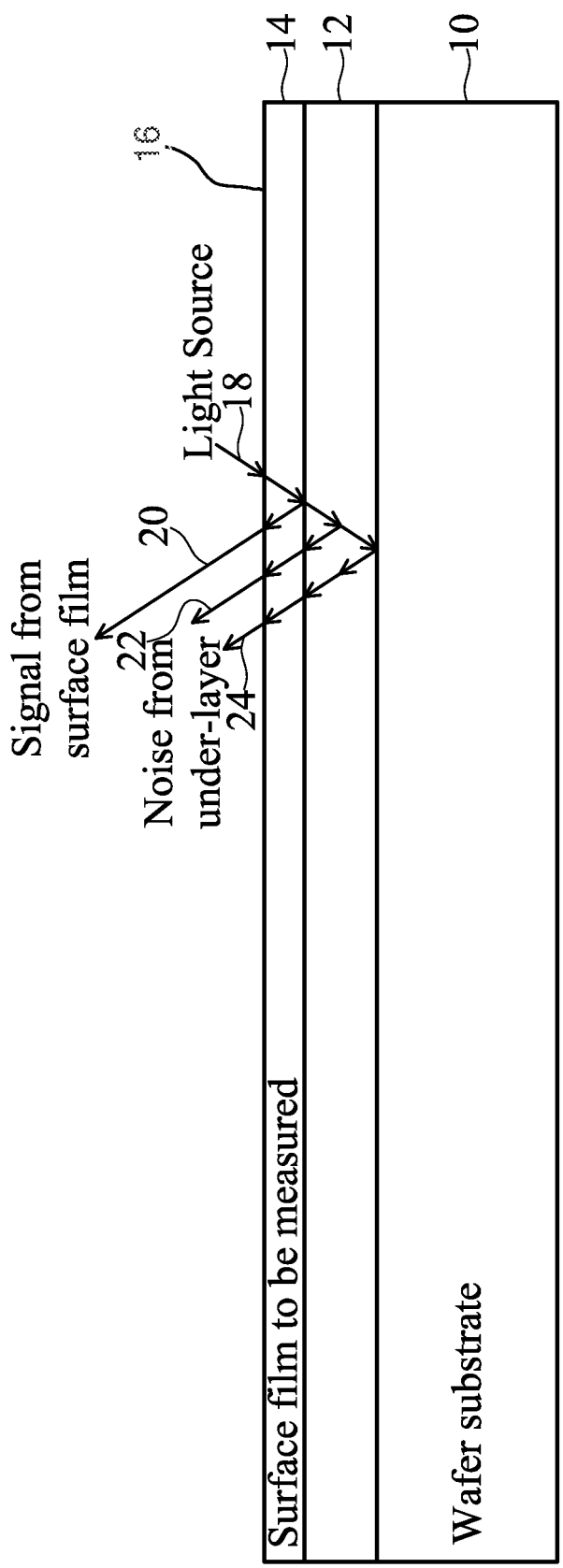
FIG. 1 is a cross-sectional view of substrate onto which two thin films have been deposited and which is subjected to an optical metrology process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One embodiment described herein is a method for evaluating thickness of a film on a substrate. Examples of a film include conductive and nonconductive layers of material on a substrate, e.g., a semiconductor substrate such as a silicon wafer. In an embodiment, a force response of one or more films of material on the substrate to exposure to one or more wavelengths of nonvisible electromagnetic radiation is detected. The detected force response is used to determine a thickness of the film. In some embodiments, the detected force response is a result of exposing more than one film layer, e.g., a plurality of film layers on the substrate, to the nonvisible electromagnetic radiation. In accordance with some disclosed embodiments, the thickness of the film is evaluated, e.g., determined, by identifying a film thickness in a lookup table of force responses and film thicknesses for a material from which the film is formed. In other embodiments, a capacitance response of one or more films of material on the substrate is detected. The detected capacitance response is used to evaluate, e.g., determine, a thickness of the film. In accordance with some disclosed embodiments, the thickness of the film is evaluated, e.g., determined, by identifying a film thickness in a lookup table of capacitance responses and film thicknesses for a material from which the film is formed.

Optimization of processes used to manufacture semiconductor devices, e.g., transistors, involves evaluation of changes in materials, thicknesses, widths, pitches, geometry and other characteristics of features formed on a semiconductor substrate. Semiconductor substrates often include tens, if not hundreds, of layers of thin films. Thicknesses of layers of thin films on semiconductor substrates have been evaluated using optical metrology techniques. Referring to FIG. 1, an example of an optical metrology technique is illustrated. In FIG. 1, the article being subjected to an optical metrology technique includes a wafer substrate 10 upon which a first film 12 has been formed on the wafer substrate 10 and a second film 14 has been formed on the first film 12. Optical metrology directs visible light 18 onto an upper surface 16 of the second film layer 14. A portion of the incident visible light penetrates through second film layer 14 and reaches first film layer 12. Some of the incident visible light that reaches first film layer 12 may reach the interface between the first film layer 12 and wafer substrate 10. A portion 20 of the incident visible light 18 is reflected by second film 14. Portions 22 and 24 of the incident visible light 18 is reflected by the first film 12 and results in undesirable "underlayer" noise with respect to the signal represented by portion 20 of reflected visible light. Such underlayer noise reduces the usefulness of the signal, represented by portion 20 of visible light, for purposes of evaluating the thickness of second film 14, e.g., thickness of the surface layer film 14.

Figure 2:
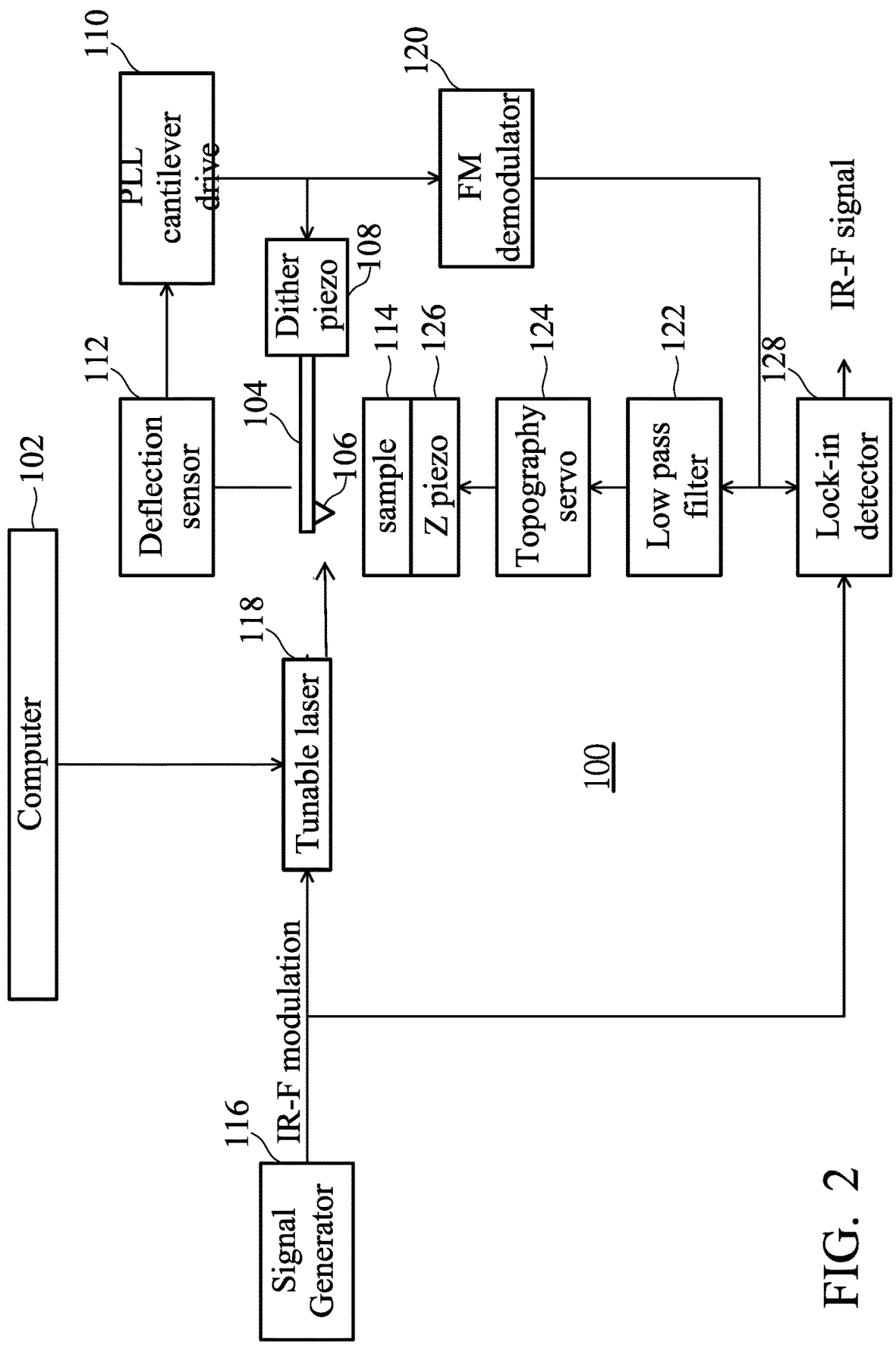
FIG. 2 is a schematic diagram of an infrared atomic force microscopy system useful in accordance with some embodiments of the present disclosure.

Referring to FIG. 2, in accordance with some embodiments of the present disclosure, infrared atomic force microscopy (IR-AFM) is utilized to evaluate thicknesses of thin film layers on a substrate. The signals generated by the infrared atomic force microscopy are less susceptible to the generation of underlayer noise associated with optical metrology techniques. In FIG. 2, a block diagram of an infrared atomic force microscopy system 100 useful in accordance with an embodiment of the present disclosure is shown. The IR-AFM system 100 includes a computer 102, which controls various components of the IR-AFM system and processes the resulting infrared atomic force (IR-F) signals. The IR-AFM system 100 further includes a cantilever 104 with a probe tip 106, a piezoelectric transducer or a dither piezo 108, a phase locked loop (PLL) cantilever driver 110 and a deflection sensor 112. In some embodiments, the dither piezo 108 creates vibrations on the cantilever 104 to make the probe tip 106 oscillate, e.g., at one of the resonant modes of the cantilever, as the probe tip is moved over a sample of interest 114 to image the sample. The dither piezo 108 is driven by the PLL cantilever driver 110, which provides a driving signal to the dither piezo. The PLL cantilever driver 110 is connected to the deflection sensor 112, which optically senses the vibrations (e.g., frequency and/or amplitude) or displacement of the cantilever 104 using a light source, e.g., a laser diode, and a photodetector, e.g., a photodiode detector (not shown). As an alternative to deflection sensor 112, IR-AFM system 100 can include a sensor capable of detecting changes in distance between the probe tip 106 and/or cantilever 104 from upper surface 16 of sample 114. In some embodiments, the PLL cantilever driver 110 generates a driving signal whose frequency tracks changes in the resonance frequency of the cantilever 104 due to force gradients acting between the probe tip 106 and the sample 114, which may include IR-F. This frequency tracking is accomplished by a phase locked loop in the PLL cantilever driver 110 that measures the phase of the cantilever vibration relative to its driving signal, and adjusts the frequency of the driving signal to maintain a fixed phase relationship between the driving signal and the cantilever vibration. The cantilever 104 with the probe tip 106, the dither piezo 108, the PLL cantilever driver 110 and the deflection sensor 112 and other illustrated components are commonly found in atomic force microscopes and therefore further descriptions of the details thereof is not provided.

The IR-AFM system 100 further includes a signal generator 116, which provides an IR-F modulation signal to a photonic source 118, which in this embodiment is a tunable laser. The IR-F modulation signal has a frequency above the range of interest for topographic following (e.g., typically in the tens or hundreds of hertz (Hz)), but well below the frequency of the mode being used for topographic imaging (or the lower mode frequency if multiple modes are being used for topographic imaging). As an example, the frequency of the IR-F modulation signal may be in the range of 1 kilohertz (kHz) to 200 kilohertz (kHz). In some embodiments, the wavelength of the tunable laser 118 is controlled by the computer 102 so that a range of wavelengths falls within the infrared portion of the electromagnetic spectrum and can be swept to produce a plot of IR-F vs. incident radiation wavelength. In some embodiments, the IR-F modulation signal applied to the tunable laser 118 turns on and off the tunable laser so that the tunable laser is on at the frequency of the IR-F modulation signal. The beam from the tunable laser is directed to the probe tip/sample interface and IR-F in response to the irradiation with the laser is detected by the probe tip 106/cantilever 104.

In some embodiments, the IR-AFM system 100 further includes an FM demodulator 120, a low pass filter 122, a topography servo 124, a z piezo or a z-directional piezoelectric transducer 126, and a signal processing circuitry in the form of a lock-in detector or amplifier 128. The FM demodulator 120 receives a tracking signal from the PLL cantilever driver 110 and measures changes in the frequency of the cantilever 104, which includes changes due to IR-F. In an embodiment, the FM demodulator 120 generates a signal that changes with respect to voltage when the vibration frequency signal of the cantilever 104 deviates from a reference voltage. The output signal from the FM demodulator 120 is transmitted through the low pass filter to allow only lower frequency of the signal, which is used to maintain a desired distance between the probe tip 106 and the sample of interest 114. In particular, the low-pass filtered signal is transmitted to the topography servo 124, which controls the z piezo 126 to maintain the desired distance between the probe tip 106 and the sample of interest 114.

In some embodiments, the output signal of the FM demodulator 120 is also transmitted to the lock-in detector 128 to detect the IR-F signal using the IR-F modulation frequency signal from the signal generator 116 as the lock-in reference frequency. The output of the lock-in detector 128 corresponds to the amplitude of the component of the FM demodulator output that is modulated at the IR-F modulation frequency. Since the laser is modulated at the IR-F modulation frequency, and therefore the IR-F is modulated at this frequency, the resonant frequency of the cantilever will be frequency modulated at this frequency, and the FM demodulator detector output will contain a component that is modulated at this frequency. The output of the lock-in detector 128 therefore is a signal whose magnitude is proportional to the magnitude of the IR-F gradient. The IR-F signal can be processed by the computer 102 to generate an image of the sample of interest 114 or an IR-F signal across the range of wavelengths generated by the laser.

Note that in the above discussion, only a single vibrational mode is described to follow topography and generate an IR-F signal. It is also possible to use two separate modes, so that an IR-F amplitude signal can also be derived. While the response time of this signal will be limited by the cantilever quality factor Q, it may be useful to generate this signal alongside that derived from the FM mode described above, allowing the user to look at both signals depending on what type of measurement is desired.

In this two mode approach, the laser is modulated at two frequencies. The first frequency corresponds to related IR-AFM, which is usually the difference frequency between the modes used for topographic sensing and IR-F sensing, but may also be the sum frequency of the two modes. In addition, a slower modulation, chosen as above for FM, is applied—for example 1 kHz. With this arrangement, an amplitude IR-F signal is generated at the IR-AFM mode, and an FM IR-F signal is generated on both modes. Note, however, that since the AR-F mode is not driven (it only responds to IR-F), it will have low or even zero amplitude at times, making it impossible to measure its frequency on an ongoing basis. Since the topographic mode is constantly driven, its frequency can be measured at all times.

Note that the use of two modulation frequencies can be useful, even if there is no intention to derive an IR-F amplitude signal on its own cantilever mode. For example, assume that a laser is only capable of short pulses, but allows a pulse repetition rate up to 10 MHz. The highest effective duty cycle occurs when this pulsing is occurring at the maximum frequency. Therefore, modulating at 10 MHz and 1 kHz would be an effective way to generate an IR-F FM signal on the mode being used for topographic imaging. In effect, the rapidly pulsing laser is treated as if it were a CW (continuous wave) source, modulated at the IR-F modulation frequency.

In accordance with an embodiment of the present disclosure, the IR-F response of a thin film can be measured by an IR-AFM utilizing contact and non-contact modes. Contact modes include modes in which the probe tip comes into contact with the upper surface of the thin film. Non-contact modes include modes in which the probe tip does not come into contact with the upper surface of the thin film. In an example of a contact mode, the force response of the thin film is detected by deflection sensor 112 as a deflection of cantilever 104. In another example of a contact mode, the probe tip is oscillated so that it periodically contacts the upper surface of the film (e.g., by tapping the upper surface of the film) and the force response of the film to the electromagnetic energy exposure is detected as a change in the amplitude or frequency of oscillation of the probe tip. In an example of a non-contact mode, the probe tip does not contact the film surface and is oscillated or vibrated. The force response of the film to the electromagnetic energy exposure in this non-contact mode is detected as a change in the amplitude or frequency of the oscillation or vibration of the probe tip. In another example of a non-contact mode, the probe tip does not contact the film surface and is oscillated or vibrated at its resonant frequency. The force response of the film to the electromagnetic energy exposure is detected as a change in the resonant frequency of the probe tip/cantilever.

In accordance with an embodiment of the present disclosure, the force response is determined during or immediately after exposure of the film to electromagnetic radiation in the infrared portion of the electromagnetic spectrum. The determined force response is used to evaluate a thickness of the analyzed film. This evaluation involves identifying a film thickness, correlated with the detected force response, in a lookup table of force responses and thicknesses for a material making up the film. In accordance with an embodiment, the lookup table of force responses and thicknesses is generated for a material making up the film. In some embodiments, the lookup table of responses and thicknesses is generated for a material making up the film of interest as well as one or more additional films, which are below the film of interest. Referring to FIG. 5, an example of a lookup table for a Material 1 is illustrated. The lookup table is specific for a Material 1 making up the film for which the operator is evaluating thickness. The lookup table includes a plurality of force responses A-I correlated with a measured thickness 1-9 for a film of the material in question. Examples of materials for which lookup tables would be useful to include conductive materials and non-conductive materials used in semiconductor device fabrication. Examples of such conductive materials include, metals or metal compounds, including, but not limited to ruthenium, palladium, platinum, tungsten, cobalt, nickel, hafnium, zirconium, titanium, tantalum, aluminum aluminides and/or conductive metal carbides (e.g., hafnium carbide, zirconium carbide, titanium carbide, and aluminum carbide), and other suitable materials for N-type metal materials, such as Ta, TiAl, TiAlN, TaCN, other N-type work function metal, or a combination thereof, and suitable P-type work function metal materials include TiN, TaN, other P-type work function metal, or combination thereof. Examples of non-conductive materials include a high dielectric constant (high-K) dielectric material such as hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), low K dielectric materials such as silicon oxynitride ($SiOxNy$), $Si_3N_4$, SiO, $SiO_2$, SiONC, SiOC, and other dielectrics or other suitable materials combinations thereof. Other materials for which lookup tables would be useful include germanium Ge or silicon germanium SiGe, SiGeB, SiP, SiC or SiCP.

The force responses reflected in the lookup table are generated using IR-AFM as described below in more detail. The measured thickness values in the lookup table are obtained by any known technique for determining thicknesses of thin films on a substrate. One example of a technique for determining thicknesses of films on a substrate for purposes of generating a lookup table in accordance with an embodiment described herein includes utilizing transmission electron microscopy on a cross-section of a wafer substrate carrying the film of interest. Embodiments in accordance with the present disclosure are not limited to utilizing transmission electron microscopy on a cross-section of a wafer substrate in order to determine thicknesses of films on a substrate that will be used to build a lookup table. Other metrology techniques that provide accurate measurement of the thicknesses of thin films on a semiconductor substrate can be used in accordance with some embodiments of the present disclosure.

Figure 3A:
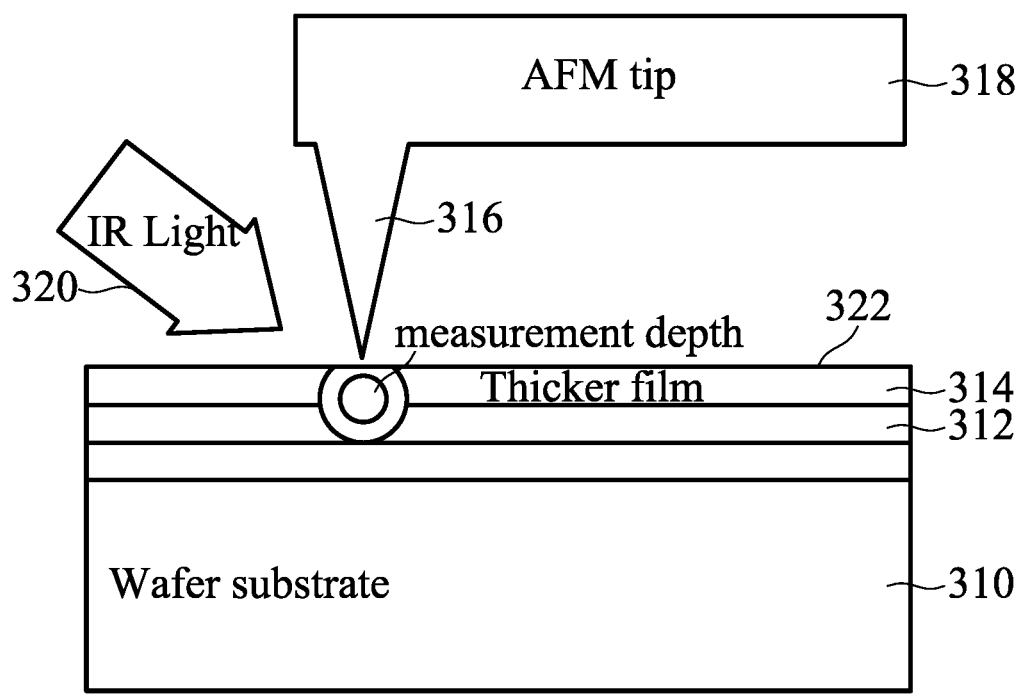
FIG. 3A is a cross-sectional view of substrate onto which two thin films have been deposited and which is being subjected to an infrared atomic force microscopy process in accordance with an embodiment of the present disclosure.
Figure 3B:
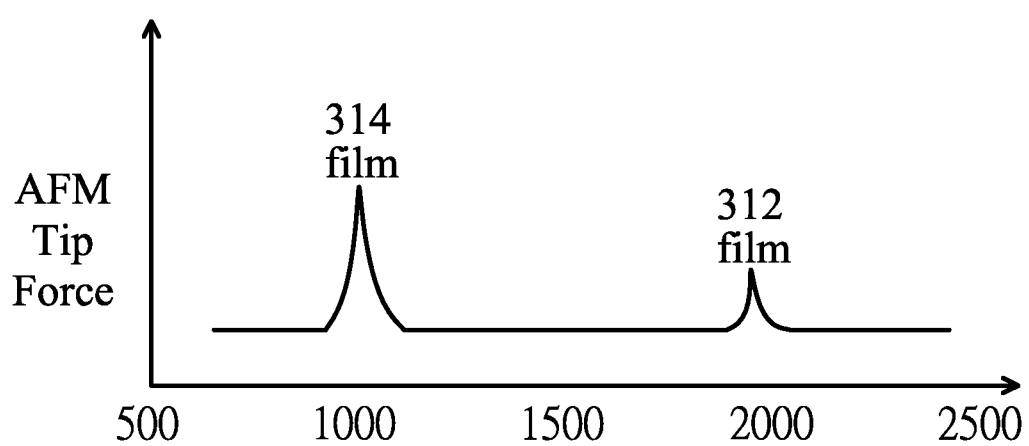
FIG. 3B is a plot of atomic force microscopy tip force as a function of scanned infrared radiation wavelength to which the films of FIG. 3A are exposed in accordance with an embodiment of the present disclosure.

Referring to FIGS. 3A, 3B and 5, an embodiment of a method for evaluating thickness of a film on a substrate in accordance with the present disclosure is described. FIG. 3A, illustrates a wafer substrate 310 and two films 312 and 314 on the wafer substrate 310. The wafer substrate 310 and films 312 and 314 are similar to the wafer substrate 10 and films 12 and 14 described above with respect to FIG. 1. In accordance with some embodiments of the present disclosure an IR-FM probe schematically illustrated as atomic force microscopy tip 316 supported at the end of cantilever 318. In accordance with this embodiment, the size of the tip 316 is chosen based on whether a force response of only the uppermost film 314 is desired or if the force response of the uppermost film 314 and the underlying film 312 is desired. If only a force response of the uppermost film 314 is desired, the size of the probe tip is selected such that the sensing depth is equal to or less than an estimated thickness of the uppermost film 314. If a force response of the uppermost film and the underlying film 312 is desired, then the size of the probe tip is selected such that the sensing depth is greater than what is estimated to be the thickness of the uppermost film 314 or what is estimated to be the combined thickness of the uppermost film 314 and the underlying film 312. Sensing depths for IR-FM probe tips range from about 1 nanometer to about 100 nanometers, e.g., 40 nanometers or less. IR-FM probe tips useful in accordance with some embodiments described herein are not limited to these ranges of depths. For example, probe tips having greater or lesser sensing depths can be used in accordance with embodiments of the present disclosure. As noted above, the IR-FM system schematically illustrated in FIG. 3A includes a source of electromagnetic radiation 320, e.g., a source of electromagnetic radiation having a wavelength within the infrared portion of the electromagnetic spectrum. Evaluation of the thickness of film 314, in accordance with an embodiment of the present disclosure, includes irradiating over a range of wavelengths, the region where the AFM tip 316 contacts or comes into close proximity of an upper surface 322 of film 314. During this irradiation, the changes in forces between the film 314 and the probe tip 316 are monitored and recorded as atomic force microscopy tip force (AFM Tip Force). These recorded force responses can be determined using AFM in a contact mode as described above or AFM in a noncontact mode as described above.

FIG. 3B illustrates an example of the results of a portion of an AFM tip force measurement carried out on the sample with a layer 314 of Material 1 and a layer 312 of Material 2 (illustrated in FIG. 3A). The plot depicted in FIG. 3B is generated by exposing the surface of the sample to a scan of infrared electromagnetic radiation while collecting AFM tip force measurements. FIG. 3B illustrates a spike in the AFM tip force at approximately 1000 nm wavelength and a less intense spike in the tip force at approximately 2000 nm. The spike at approximately 1000 nanometers represents the force response of film 314 and the spike at approximately 2000 nm reflects a force response of the underlying layer 312. In accordance with an embodiment of the present disclosure, thickness of layer 314 is evaluated by comparing the force response illustrated in FIG. 3B with a lookup table such as that illustrated in FIG. 5. The lookup table in FIG. 5 includes force response values and measured thicknesses which have been independently derived for a layer of Material 1 on substrate 310, for example, by conducting TEM on a cross-section of a number of substrates each carrying a film of Material 1 having a different thickness. The force responses in the lookup table in FIG. 5 can be the peak force response at approximately 1000 nm or the force responses in the lookup table can values associated with the integrated area under the trace of the spike. Embodiments in accordance with the present disclosure are not limited to these representations of the AFM tip force. Other characteristics of the AFM tip force vs wavelength plots can be used to correlate with the measured force responses for the film being analyzed. In accordance with other embodiments, the lookup table is generated by collecting force response data from a sample that includes a substrate that includes film layers of the same or similar composition as the substrate in question and measuring thicknesses of the upper film using TEM or similar technique.

In an alternative embodiment, a lookup table such as that illustrated in FIG. 6 is employed in accordance with embodiments of the present disclosure. The lookup table in FIG. 6 is similar to the lookup table in FIG. 5; however, the lookup table in FIG. 6 differs in that it is generated by carrying out IR-FM on a sample having a layer 312 of Material 2 and a layer 314 of Material 1 and recording the force response at two or more wavelengths (e.g., a wavelength where the Material 2 of layer 312 exhibits a spike in force response and the Material 1 of layer 314 exhibits a spike in force response) and determining thickness of at least layer 314 by conducting TEM on a cross-section of the substrate carrying the layer 314 of Material 1 and layer 312 of Material 2. Embodiments described herein are not limited to using lookup tables that include force responses at one or two wavelengths for a single layer or two layers. Embodiments described herein include those that utilize lookup tables that include force responses at more than two wavelengths and that include measured thickness values for more than one layer.

Figure 4A:
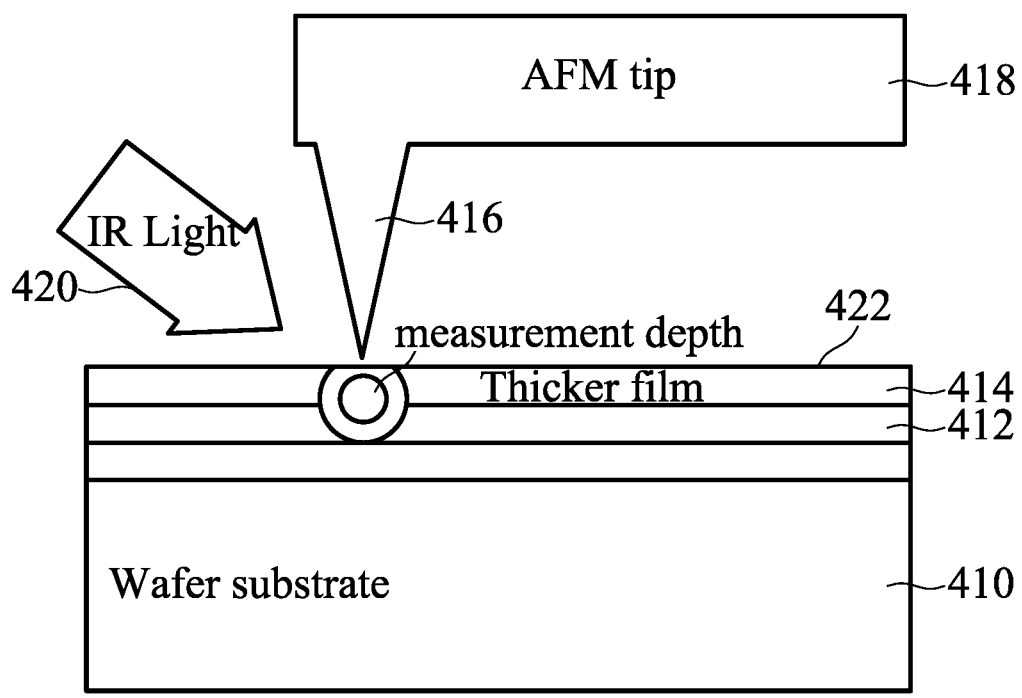
FIG. 4A is a cross-sectional view of substrate onto which two thin films have been deposited and which is being subjected to an infrared atomic force microscopy process in accordance with an embodiment of the present disclosure.
Figure 4B:
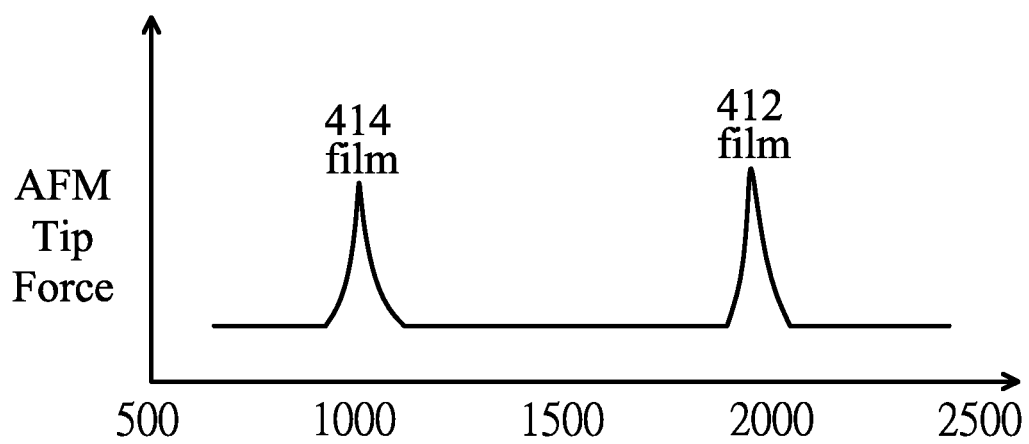
FIG. 4B is a plot of atomic force microscopy tip force as a function of scanned infrared radiation wavelength to which the films of FIG. 4A are exposed in accordance with an embodiment of the present disclosure.

Referring to FIGS. 4A and 4B, another embodiment of a method for evaluating thickness of a film on a substrate in accordance with the present disclosure is described. FIG. 4B, illustrates a wafer substrate 410 and two films 412 and 414. Wafer substrate 410 and films 412 and 414 are similar to the wafer substrate 10 and films 12 and 14 described above with respect to FIG. 1 and the wafer substrate 310 and two films 312 and 314 described above with respect to FIG. 3A. In accordance with the embodiments of FIGS. 4A and 4B, the film 412 is similar in thickness to the film 312 in FIG. 3A; however the film 414 is thinner than the film 314 in FIG. 3A. The probe tip 416, cantilever 418 and the source 420 of electromagnetic radiation illustrated in FIG. 4A are identical to the probe tip 316, cantilever 318 and the source 320 of electromagnetic radiation described above with reference to FIG. 3A. The probe tip used to generate FIG. 4B is identical to the probe tip used to generate FIG. 3B and had the same sensing depth as the probe tip used to generate FIG. 3B. In the interest of brevity, a description of the probe tip will not be repeated here. As with the embodiment of FIG. 3A, in accordance with this embodiment, the size of the tip 416 is chosen based on whether a force response of only the uppermost film 414 is desired or if the force response of the uppermost film 414 and the underlying film 412 is desired. If only a force response of the uppermost film 414 is desired, the size of the probe tip is selected such that the sensing depth is equal to or less than what is estimated to the approximate thickness of the uppermost film 414. If a force response of the uppermost film and the underlying film 412 is desired, then the size of the probe tip is selected such that the sensing depth is greater than what is estimated to be the approximate thickness of the uppermost film 414 or what is estimated to be the combined thickness of the uppermost film 414 and the underlying film 412. As noted above, the IR-FM system schematically illustrated in FIG. 4A includes a source of electromagnetic radiation 320, e.g., a source of electromagnetic radiation having a wavelength within the infrared portion of the electromagnetic spectrum. Evaluation of the thickness of film 414, in accordance with an embodiment of the present disclosure, includes irradiating over a range of wavelengths, the region where the AFM tip 416 contacts or comes into close proximity of an upper surface 422 of film 414. During this irradiation, the changes in forces detected by the probe tip 416 are monitored and recorded as atomic force microscopy tip force (AFM Tip Force). These recorded force responses can be determined using AFM in a contact mode as described above or AFM in a noncontact mode as described above.

FIG. 4B illustrates an example, of the results of a portion of an AFM tip force measurement carried out on the sample with a layer 414 of Material 1 and a layer 412 of Material 2 illustrated in FIG. 4A. The plot of FIG. 4B is generated by exposing the surface of the sample to a scan of infrared electromagnetic radiation while collecting AFM tip force measurements. FIG. 4B illustrates a spike in the AFM tip force at approximately 1000 nm wavelength and a spike in the tip force of a slightly greater peak value at approximately 2000 nm. The spike at approximately 1000 nanometers represents the force response of film 414 and the spike at approximately 2000 nm reflects a force response of the underlying layer 412. In accordance with this embodiment as with the embodiment of FIGS. 3A and 3B, thickness of layer 414 is evaluated by comparing the force response illustrated in FIG. 4B with a lookup table such as that illustrated in FIG. 5 or with the look up table of FIG. 6.

As illustrated in FIG. 4B the peak of the spike in the AFM tip force is less at 1000 nanometers compared to the peak of the spike in the AFM tip force at 1000 nanometers in FIG. 3B. This difference is attributable to film 414 in FIG. 4A being thinner than film 314 in FIG. 3A. Because film 414 is thinner than film 314, the probe tip 416 is closer to underlying film 412. The reduced thickness of film 414 and the resulting reduction in distance between probe tip 416 and film 412 compared to the distance between probe tip 316 and film 312 results in a less strong force response at 1000 nm (force response of film 414) and a more strong force response at 2000 nanometers (force response of film 412). In accordance with another embodiment of the present disclosure, thickness of film 312 in FIG. 3A and film 412 in FIG. 4A, can be evaluated utilizing the force response of films 312 or 412 at 2000 nm by comparing the force response at 2000 nm with a lookup table that includes independently determined force responses and thicknesses determined from a substrate including an upper film of the same material as the upper film of the sample being analyzed and an underlying film of the same material as the sample being analyzed.

In another embodiment, the thickness of layer 314 or layer 414 is evaluated utilizing the force response from the underlying layers 312 or 412, respectively. In this embodiment, the thickness of layers 314 or 414 is evaluated by comparing the force response of film 312 or 412 at 2000 nm to a lookup table that includes independently derived force responses at 2000 nanometers correlated with independently derived thickness values for films 314 or 414 determined from a substrate including an upper film of the same material as the upper film of the sample being analyzed and an underlying film of the same material as the sample being analyzed.

In accordance with another embodiment of the present disclosure, the AFM tip force scans illustrated in FIGS. 3B and 4B are utilized to qualitatively evaluate the relative thicknesses of films 312, 314, 412 and 414. For example, a comparison of the AFM tip force scans illustrated in FIG. 3B and with the AFM tip force scan of FIG. 4B show that at the 1000 nm wavelength the AFM tip force in FIG. 3B is greater compared to the AFM tip force at the same wavelength in FIG. 4B. This would indicate that film 314 from which FIG. 3B was generated is thicker than film 414 from which FIG. 4B was generated.

In accordance with embodiments of the present disclosure, the thickness of layers on a substrate can be evaluated with a horizontal resolution on the order of less than 10 micrometers, less than 1 micrometer, less than 500 nanometers, less than 250 nanometers, less than 150 nanometers, less than 100 nanometers or less than 50 nanometers. For example, in some embodiments the horizontal resolution is about 100 nanometers. This benefit of some embodiments of the present disclosure allows for the evaluation of thicknesses of layers that form part of nanometer sized critical features on a substrate.

In accordance with other embodiments of the present disclosure, thickness of a film on the substrate is evaluated using an alternative to IR-AFM, such as scanning capacitance microscopy (SCM). SCM is a variety of scanning probe microscopy in which a narrow probe electrode is positioned in contact with or close proximity of a sample's surface and scanned. SCM characterizes the surface of the sample using information obtained from a change in electrostatic capacitance between the surface and the probe. When scanning capacitance microscopy is used in accordance with an embodiment of the present disclosure, capacitance of a film is determined using scanning capacitance microscopy equipment. The determined capacitance of the surface film is compared to a lookup table that includes independently determined capacitance values and independently measured thicknesses of surface films of the same material as the material making up the film being analyzed. The independently measured thickness of surface films of the same material as the material making up the film being analyzed are derived using TEM on cross-sections of substrates that include films of the same material as the sample being analyzed.

Figure 7:
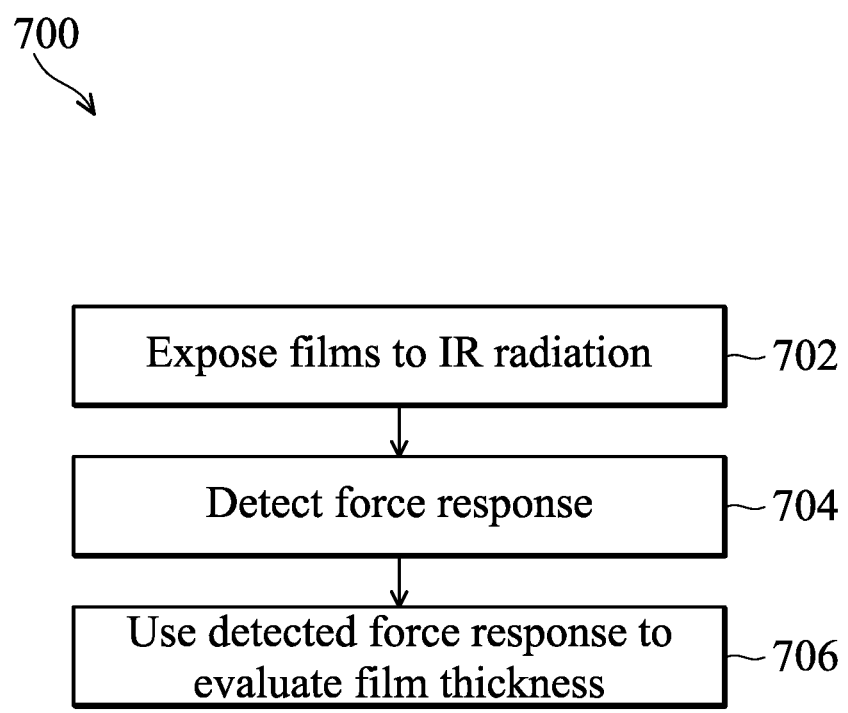
FIG. 7 is a flowchart of a method of evaluating a thickness of a film on a substrate in accordance with an embodiment of the present disclosure.

Referring to FIG. 7, a method 700 for evaluating thickness of a film on a substrate in accordance with an embodiment of the present disclosure is illustrated. The method includes step 702 of exposing a film to electromagnetic radiation in the infrared portion of the electromagnetic spectrum. During the exposure of the film to electromagnetic radiation in the infrared portion of the electromagnetic spectrum, at step 704, a force response of the irradiated film is detected using IR-FM as described above. At step 706, the detected force response is then used, to evaluate thickness of the film being analyzed. Evaluation of the thickness of the film being analyzed includes comparing the detected force response to a lookup table that includes independently measured force responses for a plurality of films of the same material as the film being analyzed and independently determined thicknesses of the plurality of films.

Figure 8:
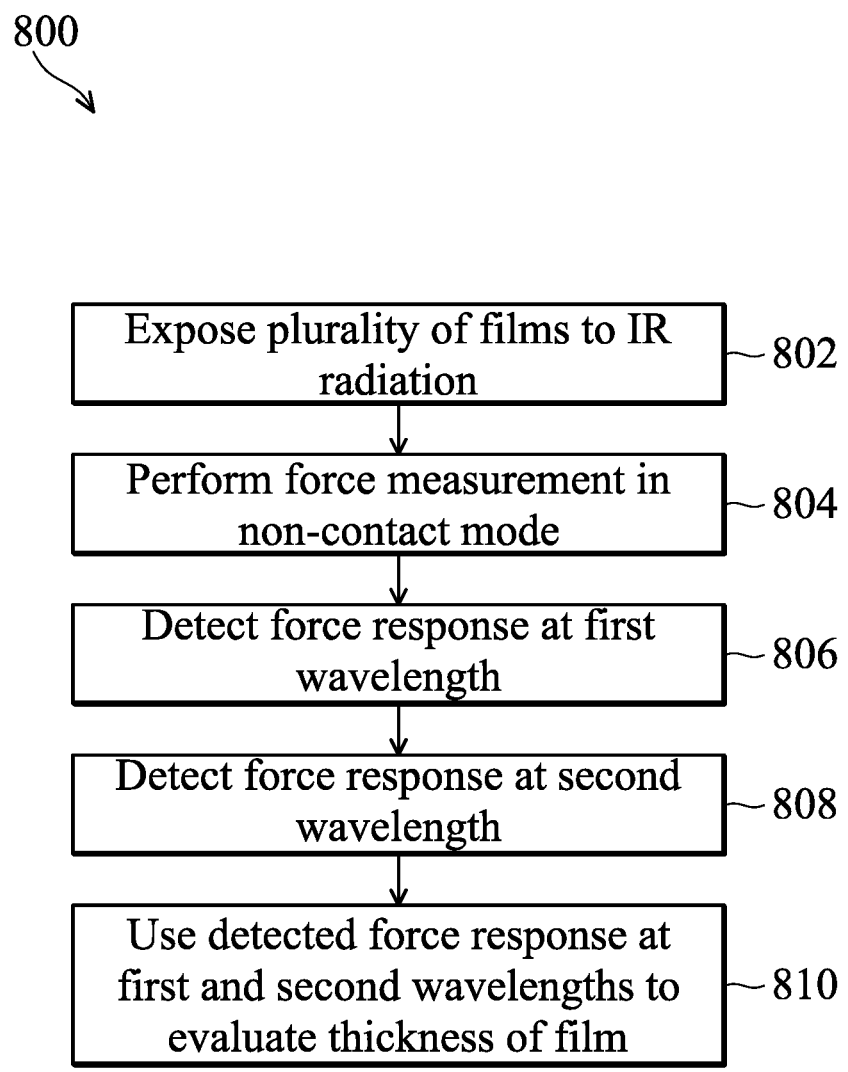
FIG. 8 is a flowchart of a method of evaluating a thickness of a film on a substrate in accordance with an embodiment of the present disclosure.

FIG. 8 illustrates another method 800 for evaluating thickness of a surface film on a substrate in accordance with an embodiment of the present disclosure. In the method of FIG. 8, a substrate including a plurality of films is exposed at step 802 to electromagnetic radiation from the infrared portion of the electromagnetic spectrum. During the irradiation step 802, a force measurement in a non-contact mode is performed at step 804 using IR-FM. At step 806, a force response is detected at a first wavelength of the infrared spectrum. At step 808, a force response is detected at a second wavelength of the infrared spectrum. The force response detected at a first wavelength of the infrared spectrum and the force response detected at a second wavelength of the infrared spectrum is used to evaluate the thickness of the surface film at step 810. Evaluation of the thickness of the surface film being analyzed at step 810 includes comparing the detected force responses at the different wavelengths to a lookup table that includes independently measured force responses at the two different wavelengths for a plurality of films of the same material as the films being analyzed and independently determined thicknesses of the plurality of films.

Figure 9:
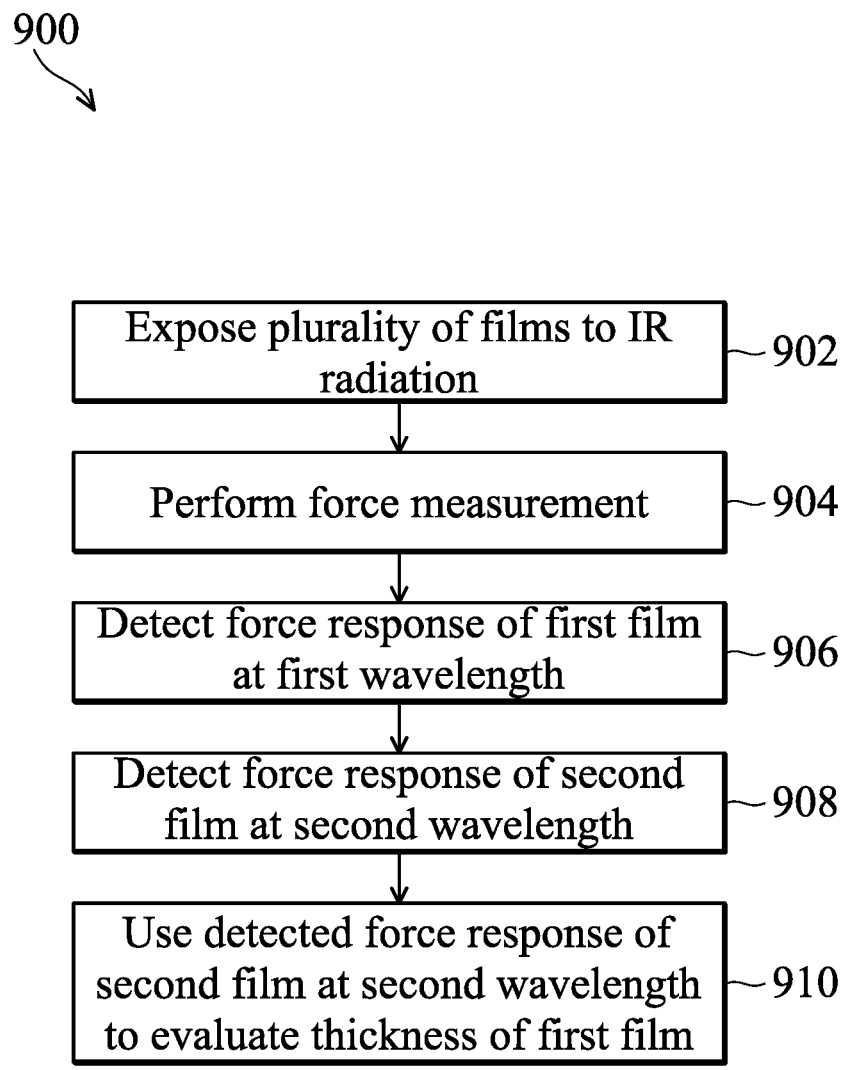
FIG. 9 is a flowchart of a method of evaluating a thickness of a film on a substrate in accordance with an embodiment of the present disclosure.

Referring to FIG. 9, another method 900 for evaluating a film on a substrate in accordance with the present disclosure includes a step of exposing a plurality of films to electromagnetic radiation from the infrared portion of the electromagnetic spectrum at step 902. During the irradiation of the plurality of films, at step 904, and atomic force microscopy force measurement is carried out on the films. At step 906, a force response of the first film at a first wavelength is detected. This first film can be an upper surface film but is not limited to an upper surface film. At step 908 a force response of a second film at a second wavelength is detected. In some embodiments, the second film is an underlying film below the upper surface film. At step 910, the detected force response of the second film at the second wavelength is used, to evaluate thickness of the first film. The thickness of the first film is evaluated by comparing the force response of the film in question to a lookup table that includes independently derived force responses at the wavelength in question correlated with independently derived thickness values of films determined from a substrate including an upper film of the same material as the upper film of the sample being analyzed and an underlying film of the same material as the sample being analyzed.

In one embodiment of the present disclosure, a thickness of a thin film on a substrate is evaluated. In this embodiment, the film is exposed to nonvisible electromagnetic radiation, e.g., electromagnetic radiation in the infrared portion of the electromagnetic spectrum. The exposed film is subjected to an atomic force microscopy technique to detect a force response of the film to the electromagnetic radiation. The detected force response is used, to determine a thickness of the film.

In another embodiment of the present disclosure, the thickness of a film on a substrate is exposed to infrared electromagnetic radiation. While exposing the film to the infrared electromagnetic radiation, an atomic force microscopy technique is applied to the film to detect a force response of the film to the electromagnetic radiation. A thickness of the film is then determined using the results of the atomic force microscopy technique.

In another embodiment, a plurality of films on a substrate is exposed to electromagnetic radiation in the infrared portion of the electromagnetic spectrum. During this irradiation, a non-contact atomic force microscopy technique is applied to the films on the substrate to detect a force response of the film at a first wavelength of the radiation and at a 2' wavelength of the radiation. These detected force responses are used, to evaluate a thickness of one of the plurality of films.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for evaluating thickness of a film on a substrate, comprising:
   exposing the film to non-visible electromagnetic radiation;
   detecting a capacitance response of the film to the exposing the film to the non-visible electromagnetic radiation; and
   using the capacitance response of the film from the detecting step to determine a thickness of the film.

2. The method of claim 1, wherein the exposing the film to non-visible electromagnetic radiation includes exposing the film to electromagnetic radiation in a near infrared portion of the electromagnetic spectrum.

3. The method of claim 1, wherein the detecting a capacitance response of the film includes determining a capacitance response of the film using scanning capacitance microscopy.

4. The method of claim 3, wherein the scanning capacitance microscopy is conducted in a non-contact mode.

5. The method of claim 3, wherein the scanning capacitance microscopy is conducted in a contact mode.

6. The method of claim 5, further comprising:
   exposing a first underlying film, below the film, to the non-visible electromagnetic radiation; and
   detecting a capacitance response of the first underlying film to the exposing the first underlying film to the non-visible electromagnetic radiation; and
   using the capacitance response of the first underlying film from the detecting step for the first underlying film in combination with the capacitance response of the film from the detecting step for the film to determine a thickness of the film.

7. The method of claim 6, further comprising:
   exposing a second underlying film, below the film and the first underlying film, to the non-visible electromagnetic radiation; and
   detecting a capacitance response of the second underlying film to the exposing an underlying film and first underlying film to the non-visible electromagnetic radiation; and
   using the capacitance response of the second underlying film from the detecting step for the second underlying film in combination with the capacitance response of the film from the detecting step for the film to determine a thickness of the film.

8. The method of claim 6, wherein the capacitance response of the film occurs at a first wavelength of electromagnetic radiation and the capacitance response of the underlying film occurs at a second wavelength of electromagnetic radiation different from the first wavelength.

9. The method of claim 1, wherein the using the capacitance response of the film from the detecting step for the film to determine a thickness of the film includes identifying a thickness correlated with a capacitance response in a look up table of capacitance force responses and film thicknesses for a material making up the film.

10. A method for determining thickness of a film on a substrate, comprising:
    exposing the film to infrared electromagnetic radiation;
    while exposing the film to the infrared electromagnetic radiation, performing a capacitance measurement on the film using scanning capacitance microscopy;
    determining a thickness of the film using the results of the capacitance measurement on the film.

11. The method of claim 10, wherein the capacitance measurement using scanning capacitance microscopy utilizes changes in electrostatic capacitance between a surface of the film and a capacitance probe used in the scanning capacitance microscopy.

12. The method of claim 10, wherein the film is the uppermost film.

13. The method of claim 10, wherein the capacitance measurement is carried out in a contact mode, wherein a probe of a scanning capacitance microscopy equipment contacts a surface of the film.

14. The method of claim 10, wherein the infrared electromagnetic radiation is near infrared electromagnetic radiation.

15. The method of claim 10, where the capacitance measurement is carried out in a non-contact mode, wherein a probe of a scanning capacitance microscopy equipment does not contact the surface of the film.

16. A method for evaluating thickness of a film on a substrate, comprising:
    exposing a plurality of films on the substrate to electromagnetic radiation in the infrared portion of the electromagnetic spectrum;
    while exposing the plurality of films to the electromagnetic radiation in the infrared portion of the electromagnetic spectrum, performing a scanning capacitance microscopy measurement on the plurality of films using a scanning capacitance probe microscope operating in a non-contact mode;
    detecting a scanning capacitance probe microscopy response of the plurality of films at a first wavelength of the electromagnetic radiation in the infrared portion of the electromagnetic spectrum;
    detecting a scanning capacitance probe microscopy response of the plurality of films at a second wavelength of the electromagnetic radiation in the infrared portion of the electromagnetic spectrum;
    using the detected scanning capacitance probe microscopy response at the first wavelength and the detected scanning capacitance probe microscopy response at the second wavelength to evaluate a thickness of one of the plurality of films.

17. The method of claim 16, wherein the using the detected scanning capacitance probe microscopy response at the first wavelength and the detected scanning capacitance probe microscopy response at the second wavelength to determine a thickness of one of the plurality of films includes identifying a thickness correlated with a combination of the scanning capacitance probe microscopy response at the first wavelength and a scanning capacitance probe microscopy response at the second wavelength in a look up table of scanning capacitance probe microscopy responses at the first wavelength and scanning capacitance probe microscopy responses at the second wavelength for a material making up the one of the plurality of films.

18. The method of claim 16, wherein the plurality of films have a combined thickness of less than 40 nanometers.

19. The method of claim 16, wherein the one of the plurality of films is the uppermost film.

20. The method of claim 16, wherein the one of the plurality of films is not an uppermost film.

* * * * *